(12) United States Patent
Suzuki (10) Patent No.: US 7,288,479 B2
(45) Date of Patent: Oct. 30, 2007

(54) METHOD FOR FORMING A BARRIER/SEED LAYER FOR COPPER METALLIZATION

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 267 days.

(21) Appl. No.: 11/096,095

(22) Filed: Mar. 31, 2005

(65) Prior Publication Data

US 2006/0223310 A1 Oct. 5, 2006

(51) Int. Cl.
H01L 21/768 (2006.01)
(52) U.S. Cl. .............................. 438/650; 257/E21.584
(58) Field of Classification Search ........ 257/E23.161, 257/E21.586; 438/650, 686
See application file for complete search history.

(56) References Cited

U.S. PATENT DOCUMENTS

| | | |
|---|---|---|
| 6,303,809 B1 | 10/2001 | Chi et al. .................. 556/136 |
| 6,319,832 B1 | 11/2001 | Uhlenbrock et al. ........ 438/681 |
| 6,440,495 B1 | 8/2002 | Wade et al. ................. 427/250 |
| 6,605,735 B2 | 8/2003 | Kawano et al. ............. 556/136 |
| 6,713,373 B1 | 3/2004 | Omstead .................... 438/608 |
| 7,074,719 B2* | 7/2006 | Kim et al. .................. 438/687 |
| 2002/0036309 A1* | 3/2002 | Sekiguchi et al. .......... 257/301 |
| 2002/0100693 A1* | 8/2002 | Lu et al. .................... 205/157 |
| 2003/0129306 A1 | 7/2003 | Wade et al. ............. 427/255.28 |
| 2004/0013577 A1 | 1/2004 | Ganguli et al. ............. 422/129 |
| 2004/0105934 A1 | 6/2004 | Chang et al. .......... 427/255.28 |
| 2004/0241321 A1 | 12/2004 | Ganguli et al. ........ 427/255.28 |
| 2005/0081882 A1 | 4/2005 | Greer et al. ................. 134/1.1 |
| 2005/0110142 A1 | 5/2005 | Lane et al. .................. 257/751 |
| 2005/0186341 A1 | 8/2005 | Hendrix et al. .......... 427/248.1 |
| 2006/0068098 A1* | 3/2006 | Yamasaki et al. ........ 427/248.1 |
| 2006/0110530 A1 | 5/2006 | Suzuki et al. |

OTHER PUBLICATIONS

Wang et al., Low-temperature chemical vapor deposition and scaling limit of ultrathin Ru films, Applied Physics Letters, Feb. 23, 2004, pp. 1380-1382, vol. 84, No. 8, American Institute of Physics, Melville, NY.
European Patent Office, International Search Report and Written Opinion, Sep. 15, 2006, 8 pp.

* cited by examiner

*Primary Examiner*—Carl Whitehead, Jr.
*Assistant Examiner*—Jennifer M. Dolan
(74) *Attorney, Agent, or Firm*—Wood, Herron & Evans, LLP (57) ABSTRACT

A method for improving adhesion of Cu to a Ru layer in Cu metallization. The method includes providing a substrate in a process chamber of a deposition system, depositing a Ru layer on the substrate in a chemical vapor deposition process, and forming a Cu seed layer on the Ru layer to prevent oxidation of the Ru layer. The Cu seed layer is partially or completely oxidized prior to performing a Cu bulk plating process on the substrate. The oxidized portion of the Cu seed layer is substantially dissolved and removed from the substrate during interaction with a Cu plating solution, thereby forming a bulk Cu layer with good adhesion to the underlying Ru layer.

15 Claims, 5 Drawing Sheets

METHOD FOR FORMING A BARRIER/SEED LAYER FOR COPPER METALLIZATION

FIELD OF THE INVENTION

The present invention relates to semiconductor processing, and more particularly, to a method for forming a copper seed layer on a ruthenium layer for copper metallization. A bulk copper layer can subsequently be plated onto the seed layer to form a copper interconnect.

BACKGROUND OF THE INVENTION

The use of copper (Cu) metal in multilayer metallization schemes for manufacturing integrated circuits requires the use of a diffusion barrier layer to promote adhesion and growth of the Cu layers and to prevent diffusion of Cu into the dielectric materials. Barrier layers that are deposited onto dielectric materials can include refractive materials, such as tungsten (W), molybdenum (Mo), and tantalum (Ta or TaN), that are non-reactive and immiscible in Cu, and can offer low electrical resistivity.

More recently, ruthenium (Ru) metal has been identified as a potential barrier layer for copper metallization since it is expected to behave similarly to the above-mentioned refractory metals. Furthermore, it is possible that the use of Ru can permit the use of only one layer, as opposed to two layers, such as Ta/TaN. Moreover, current research has suggested that a Ru layer can possibly further replace a Cu seed layer deposited onto the Ta/TaN barrier, and bulk Cu fill by a plating process can proceed directly following Ru deposition. However, a potential drawback to this approach is that a Ru layer can become oxidized if exposed to air or other oxygen-containing ambients and form a $RuO_x$ layer prior to the bulk Cu fill process. The presence of a $RuO_x$ layer can lead to poor adhesion of the bulk Cu fill layer to the underlying Ru layer, and poor adhesion can result in electro-migration (EM) and stress-migration (SM) problems, as well as poor device production yields. Thus, new processing methods are needed for improving adhesion of Cu to a substrate during integration of Ru layers into Cu metallization schemes.

SUMMARY OF THE INVENTION

A method for improving adhesion of Cu to a Ru layer in Cu metallization. According to an embodiment of the invention, a substrate is provided in a process chamber of a deposition system, a Ru layer is deposited on the substrate in a chemical vapor deposition process, and a Cu seed layer is formed on the Ru layer to prevent oxidation of the Ru layer. The Cu seed layer is partially or completely oxidized prior to performing a Cu bulk plating process on the substrate. The oxidized portion of the Cu seed layer can be substantially dissolved and removed from the substrate during interaction with a Cu plating solution, thereby forming a bulk Cu layer with good adhesion the underlying Ru layer.

BRIEF DESCRIPTION OF THE DRAWINGS

In the drawings:

FIGS. 5A-6B schematically show formation of Cu interconnects according to embodiments of the invention.

DETAILED DESCRIPTION OF SEVERAL EMBODIMENTS OF THE INVENTION

Embodiments of the invention reduce or eliminate problems of poor adhesion between a plated bulk Cu layer and an underlying Ru layer in Cu interconnect metallization. Embodiments of the invention can reduce electro-migration (EM) and stress-migration (SM) problems, and improve device production yields. Embodiments of the invention provide a method for depositing a Ru layer on a substrate in a chemical vapor deposition process and forming a Cu seed layer onto the Ru layer to prevent oxidation of the Ru layer. Embodiments of the invention further provide a method for plating bulk Cu onto a substrate containing the Ru layer and the Cu seed layer.

According to an embodiment of the invention, a thin Cu seed layer is formed on the Ru layer to reduce or eliminate formation of an oxidized Ru layer on the substrate. The thin Cu seed layer forms a cap layer on the Ru layer and it is partially or completely oxidized prior to performing a Cu bulk plating process on the substrate. The oxidized portion of the thin Cu seed layer is substantially dissolved and removed from the substrate during interaction with a Cu plating solution, thereby forming a bulk Cu layer with good adhesion to the underlying Ru layer.

In the following description, in order to facilitate a thorough understanding of the invention and for purposes of explanation and not limitation, specific details are set forth, such as a particular geometry of the deposition systems and the processing tool and descriptions of various components. However, it should be understood that the invention may be practiced in other embodiments that depart from these specific details.

According to an embodiment of the invention, a Ru layer can be deposited on the substrate in a chemical vapor deposition process by exposing the substrate to a ruthenium carbonyl precursor or a ruthenium organometallic precursor, but this is not required for the invention as other ruthenium-containing precursors capable of forming a Ru metal layer suitable for use as a layer for Cu metallization may be utilized.

According to an embodiment of the invention, the ruthenium-containing precursor can be a ruthenium carbonyl precursor such as $Ru_3(CO)_{12}$. According to another embodiment of the invention the ruthenium-containing precursor can be a ruthenium organometallic precursor such as (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), or (2,4-dimethylpentadienyl) (methylcyclopentadienyl) ruthenium. The above-mentioned precursors are not required for the invention, as other ruthenium organometallic precursors may be used, including the liquid precursor bis(ethylcyclopentadienyl) ruthenium (Ru(EtCp)$_2$), as well as combinations of these and other precursors.

Figure 1:
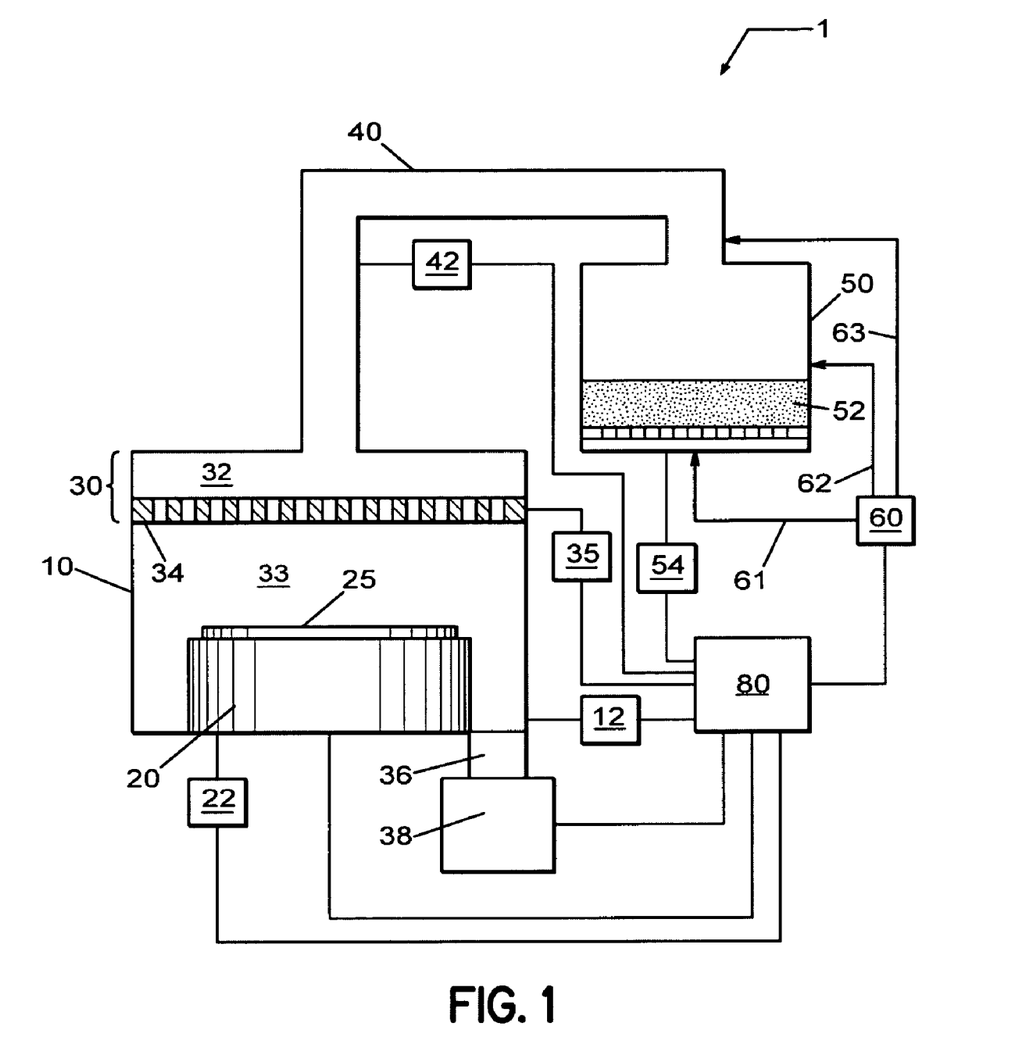
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a Ru metal layer on a substrate from a ruthenium-containing precursor according to one embodiment of the invention. The following sections describe the use of a ruthenium carbonyl precursor, $Ru_3(CO)_{12}$, however as described above, other ruthenium carbonyl precursors and ruthenium organometallic precursors may be used without departing from the scope of the invention. The deposition system 1 comprises a process chamber 10 having a substrate holder 20 configured to support a substrate 25 upon which the ruthenium metal layer is formed. The process chamber 10 is coupled to a metal precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the Ru metal layer on the substrate 25, and suitable for vaporization of the ruthenium carbonyl precursor 52 in the metal precursor vaporization system 50.

Still referring to FIG. 1, the metal precursor vaporization system 50 is configured to store a ruthenium carbonyl precursor 52, to heat the ruthenium carbonyl precursor 52 to a temperature sufficient for vaporizing the ruthenium carbonyl precursor 52, and to introduce ruthenium carbonyl precursor vapor to the vapor precursor delivery system 40. The ruthenium carbonyl precursor 52 ($Ru_3(CO)_{12}$) is a solid under the selected heating conditions in the metal precursor vaporization system 50, however, those skilled in the art will appreciate that other ruthenium carbonyl precursors and ruthenium organometallic precursors that are liquids under the selected heating conditions can be used without departing from the scope of the invention.

In order to achieve the desired temperature for subliming the solid ruthenium carbonyl precursor 52, the metal precursor vaporization system 50 is coupled to a vaporization temperature control system 54 configured to control the vaporization temperature. For instance, the temperature of the ruthenium carbonyl precursor 52 is generally elevated to approximately 40° C. to approximately 45° C. in conventional systems in order to sublime the $Ru_3(CO)_{12}$. At this temperature, the vapor pressure of the $Ru_3(CO)_{12}$, for instance, ranges from approximately 1 to approximately 3 mTorr. As the ruthenium carbonyl precursor 52 is heated to cause sublimation, a CO-containing gas can be passed over or through the ruthenium carbonyl precursor 52, or any combination thereof. The CO-containing gas contains CO and optionally an inert carrier gas, such as $N_2$, or a noble gas (i.e., He, Ne, Ar, Kr, or Xe), or a combination thereof.

For example, a gas supply system 60 is coupled to the metal precursor vaporization system 50, and it is configured to, for instance, supply CO, a carrier gas, or a mixture thereof, beneath the ruthenium carbonyl precursor 52 via feed line 61, or over the ruthenium carbonyl precursor 52 via feed line 62. In addition, or in the alternative, the gas supply system 60 is coupled to the vapor precursor delivery system 40 downstream from the metal precursor vaporization system 50 to supply the gas to the vapor of the ruthenium carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the CO-containing gas can be between about 0.1 standard cubic centimeters per minute (sccm) and about 1000 sccm. Alternately, the flow rate of the CO-containing gas can be between about 10 sccm and about 500 sccm. Still alternately, the flow rate of the CO-containing gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 500 sccm.

Downstream from the metal precursor vaporization system 50, the process gas containing the ruthenium carbonyl precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the ruthenium carbonyl precursor vapor as well as condensation of the ruthenium carbonyl precursor vapor.

Referring again to FIG. 1, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

Once the process gas containing the ruthenium carbonyl precursor vapor enters the processing zone 33 of process chamber 10, the ruthenium carbonyl precursor vapor thermally decomposes upon adsorption at the substrate surface due to the elevated temperature of the substrate 25, and a Ru metal layer is formed on the substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

Conventional systems have contemplated operating the metal precursor vaporization system 50, as well as the vapor precursor delivery system 40, within a temperature range of approximately 40° C. to approximately 45° C. for $Ru_3(CO)_{12}$ in order to prevent decomposition, which occurs at higher temperatures. For example, $Ru_3(CO)_{12}$ can decompose at elevated temperatures to form by-products, such as those illustrated below:

$$Ru_3(Co)_{12}(ad) \Leftrightarrow Ru_3(CO)_x(ad) + (12-x)CO(g) \qquad (1)$$

or, $$Ru_3(CO)_x(ad) \Leftrightarrow 3Ru(s) + xCO(g) \qquad (2)$$

wherein these by-products can adsorb (ad), i.e., condense, on the interior surfaces of the deposition system 1. The accumulation of material on these surfaces can cause problems from one substrate to the next, such as process repeatability. Alternatively, for example, $Ru_3(CO)_{12}$ can condense on the internal surfaces of the deposition system 1, viz.

$$Ru_3(CO)_{12}(g) \Leftrightarrow Ru_3(CO)_{12}(ad) \qquad (3).$$

In summary, low vapor pressure of some ruthenium carbonyl precursors (e.g., $Ru_3(CO)_{12}$) and the small process window, results in very low deposition rate of a metal layer on the substrate 25.

The current inventors have realized that adding a CO gas to the ruthenium carbonyl precursor vapor can reduce the above-mentioned problems that limit the delivery of the ruthenium carbonyl precursor to the substrate. Thus, according to an embodiment of the invention, the CO gas is added to the ruthenium carbonyl precursor vapor to reduce dissociation of the ruthenium carbonyl precursor vapor in the gas line, thereby shifting the equilibrium in Equation (1) to the left and reducing premature decomposition of the ruthenium carbonyl precursor in the vapor precursor delivery system 40 prior to delivery of the ruthenium carbonyl precursor to the process chamber 10. The inventors have shown that addition of the CO gas to the ruthenium carbonyl precursor vapor allows for increasing the vaporization temperature from approximately 40° C. to approximately 100° C., or higher. The elevated temperature increases the vapor pressure of the ruthenium carbonyl precursor, resulting in increased delivery of the ruthenium carbonyl precursor to the process chamber and, hence, increased deposition rate of the metal on the substrate 25. Furthermore, the inventors have visually observed that flowing a mixture of Ar and the CO gas over or through the ruthenium carbonyl precursor reduces premature decomposition of the ruthenium carbonyl precursor.

According to an embodiment of the invention, the addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Since the addition of the CO gas to the ruthenium carbonyl precursor vapor increases the thermal stability of the ruthenium carbonyl precursor vapor, the relative concentration of the ruthenium carbonyl precursor vapor to the CO gas in the process gas can be utilized to control the decomposition rate of the ruthenium carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired vaporization temperature of the ruthenium carbonyl precursor and for achieving a desired deposition rate of the ruthenium carbonyl precursor on the substrate 25.

Furthermore, the amount of CO gas in the process gas can be selected so that Ru metal deposition on the substrate 25 from a ruthenium carbonyl precursor occurs in a kinetic-limited temperature regime (also commonly referred to as a reaction rate limited temperature regime). For example, the amount of CO gas in the process gas can be increased until the Ru metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on ruthenium carbonyl precursor flow rate and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall. Step coverage is commonly defined as the metal layer thickness on the sidewall divided by the metal layer thickness away from the feature.

Still referring to FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, and the gas supply system 60.

Figure 2:
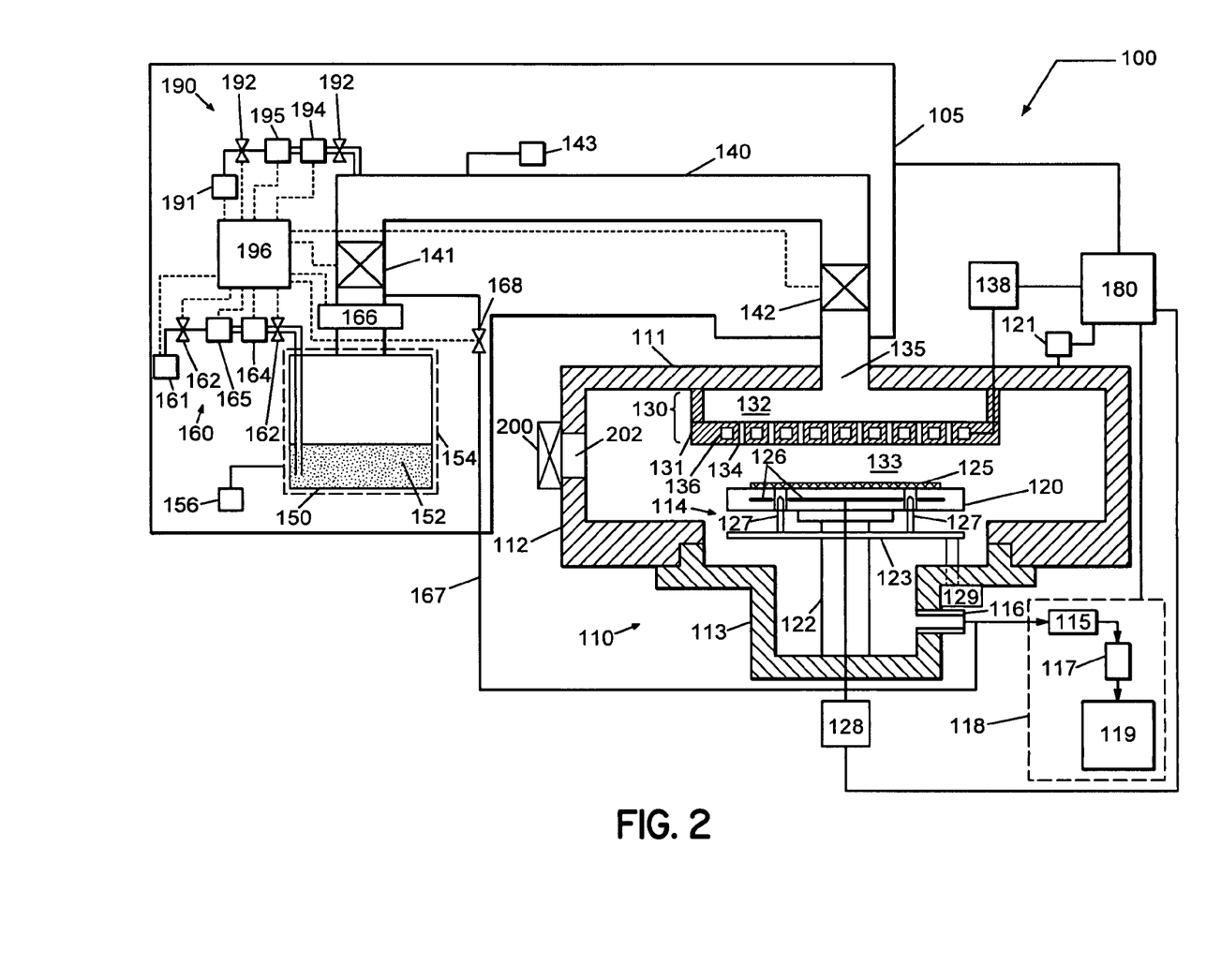
FIG. 2 depicts a schematic view of a deposition system according to another embodiment of the invention.

In another embodiment, FIG. 2 illustrates a deposition system 100 for depositing a metal layer, such as a Ru metal layer, on a substrate. The deposition system 100 comprises a process chamber 110 having a substrate holder 120 configured to support a substrate 125 upon which the Ru metal layer is formed. The process chamber 110 is coupled to a precursor delivery system 105 having metal precursor vaporization system 150 configured to store and vaporize a ruthenium carbonyl precursor 152, and a vapor precursor delivery system 140 configured to transport the vapor of the ruthenium carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the ruthenium carbonyl precursor vapor, and enable deposition of a Ru metal layer on the substrate 125. The substrate holder 120 is heated to a pre-determined temperature that is suitable for depositing the desired Ru metal layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 200 mTorr. Alternately, the process chamber pressure can be between about 2 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a ruthenium carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the ruthenium carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C. For a $Ru_3(CO)_{12}$ precursor, the temperature of the vapor distribution plate 131 can be maintained at or above a temperature of about 65° C. to avoid precursor condensation on the plate 131.

As illustrated in FIG. 2, a metal precursor vaporization system 150 is configured to hold a ruthenium carbonyl precursor 152 and to evaporate (or sublime) the ruthenium carbonyl precursor 152 by elevating the temperature of the ruthenium carbonyl precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the ruthenium carbonyl precursor 152 to maintain the ruthenium carbonyl precursor 152 at a temperature that produces a desired vapor pressure of ruthenium carbonyl precursor 152. The precursor heater 154 is coupled to a vaporization temperature control system 156 configured to control the temperature of the ruthenium carbonyl precursor 152. For example, the precursor heater 154 can be configured to adjust the temperature of the ruthenium carbonyl precursor 152 from about 40° C. to about 150° C., or from about 60° C. to about 90° C.

As the ruthenium carbonyl precursor 152 is heated to cause evaporation (or sublimation), a CO-containing gas can be passed over or through the ruthenium carbonyl precursor 152, or any combination thereof. The CO-containing gas contains CO and optionally an inert carrier gas, such as $N_2$, or a noble gas (i.e., He, Ne, Ar, Kr, Xe). According to an embodiment of the invention, a CO gas can be added to the inert gas. Alternately, other embodiments contemplate the CO gas replacing the inert gas. For example, a gas supply system 160 is coupled to the metal precursor vaporization system 150, and it is configured to, for instance, flow the CO gas, the inert gas, or both, over or through the ruthenium carbonyl precursor 152. Although not shown in FIG. 2, gas supply system 160 can also or alternatively be coupled to the vapor precursor delivery system 140 to supply the carrier gas and/or CO gas to the vapor of the metal precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of the CO-containing gas can range from approximately 0.1 standard cubic centimeters per minute (sccm) to approximately 1000 sccm.

Additionally, a sensor 166 is provided for measuring the total gas flow from the metal precursor vaporization system 150. The sensor 166 can, for example, comprise a mass flow controller, and the amount of ruthenium carbonyl precursor vapor delivered to the process chamber 110 can be determined using sensor 166 and mass flow controller 165. Alternately, the sensor 166 can comprise a light absorption sensor to measure the concentration of the ruthenium carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the ruthenium carbonyl precursor vapor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the ruthenium carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the ruthenium carbonyl precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the ruthenium carbonyl precursor vapor. Sensor 166 is also connected to controller 195 and, based on output of the sensor 166, controller 195 can control the carrier gas flow through mass flow controller 165 to obtain the desired ruthenium carbonyl precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted ruthenium carbonyl precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex.

The controller 180 may be implemented as a general-purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet and a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

Figure 3:
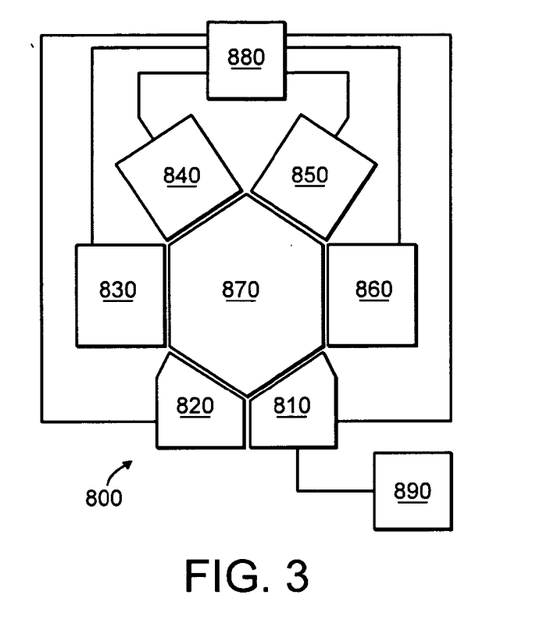
FIG. 3 depicts a schematic view of a processing tool for processing a substrate according to an embodiment of the invention.

FIG. 3 schematically shows a processing tool for processing a substrate according to an embodiment of the invention. The processing tool 800 contains substrate loading chambers 810 and 820, processing systems 830-860, robotic transfer system 870, and controller 880. In one embodiment of the invention, the processing system 840 can be configured for depositing a Ru metal layer on a substrate in a chemical vapor deposition process. The processing system 840 can, for example, be the deposition systems 1, 100 depicted in FIGS. 1, 2. According to one embodiment of the invention, a Cu seed layer can be formed on the substrate in the processing system 850. The processing system 850 can be configured to carry out physical vapor deposition of the Cu seed layer and can, for example, be configured to carry out ionized physical vapor deposition (IPVD). IPVD systems for depositing a Cu metal layer onto a substrate are well known to those skilled in the art. One example of an IPVD system is described in U.S. Pat. No. 6,287,435. The processing system 830 can, for example, be a pre-clean system for cleaning any oxide or other contaminants from a substrate prior to depositing a Ru layer on the substrate or prior to forming a Cu seed layer on the Ru layer.

The processing tool 800 is configured for depositing a Cu seed layer on a Ru layer without exposing the Ru layer to air, thus preventing formation of a $RuO_x$ layer prior to depositing the Cu seed layer. Any $RuO_x$ layer formed can be removed in the processing system 830 or, alternately, by light sputtering (e.g., Ar ion sputtering) in the processing system 850.

A plating system 890 is operatively coupled to the processing system 800 through the substrate loading chamber 810. The plating system 890 can, for example, be configured for performing an electrochemical or electroless plating process for plating bulk Cu onto a substrate containing a Ru layer and a Cu seed layer formed on the Ru layer. Electrochemical and electroless plating systems are well known to those skilled in the art and are readily available commercially. Still alternately, the processing system 860 can be a plating system for plating bulk Cu onto a substrate containing a Ru layer and a Cu seed layer formed on the Ru layer.

According to an embodiment of the invention, the Cu seed layer is at least partially oxidized, for example, the substrate is exposed to air during transfer from the substrate loading chamber to the plating system 890. The air exposure can partially or completely oxidize the Cu seed layer prior to Cu plating. However, as described above, the oxidized Cu seed layer can be substantially dissolved and removed from the substrate during interaction with a Cu plating solution, thereby forming a bulk Cu layer with good adhesion to the underlying Ru layer.

The processing tool 800 can be controlled by a controller 880. The controller 880 can be coupled to and exchange information with substrate loading chambers 810 and 820, processing systems 830-860, and robotic transfer system 870. In one example, the controller 880 can further control the processing system 890. In another example, the processing system 890 can contain a separate controller for controlling the functions of the processing system 890. For example, a program stored in the memory of the controller 880 can be utilized to control the aforementioned components of the processing 800 according to a desired process, and to perform any functions associated with monitoring the process. One example of controller 880 is a DELL PRECISION WORKSTATION 610™, available from Dell Corporation, Austin, Tex.

Figure 4:
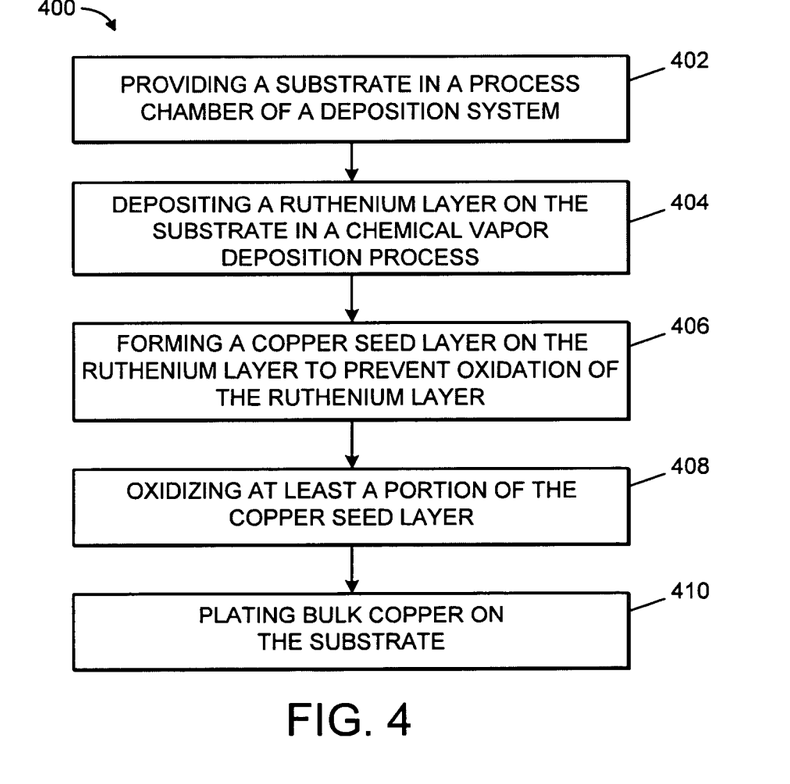
FIG. 4 is a flowchart of a method of forming a Cu interconnect, including depositing a Ru layer on a substrate and forming a Cu seed layer on the Ru layer according to an embodiment of the invention.

FIG. 4 is a flowchart of a method of forming a Cu metallization, including depositing a Ru layer on a substrate and forming a Cu seed layer on the Ru layer according to an embodiment of the invention. The method 400 includes, at 402, providing a substrate in a process chamber of a deposition system. The deposition system can, for example, include the depositions systems 1, 100 described above in FIGS. 1 and 2. Furthermore, the deposition system can be the processing system 840 of the processing tool 800 in FIG. 3. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, and as further described in FIGS. 5A-6B, the substrate can be a patterned substrate containing one or more vias or trenches, or combinations thereof.

In step 404, a Ru layer is deposited on the substrate in a chemical vapor deposition process. According to one embodiment of the invention, a thickness of the Ru layer can be between about 1 nm and about 30 nm. According to one embodiment of the invention, the Ru layer can be deposited by exposing the substrate to a process gas containing a ruthenium carbonyl precursor vapor and a CO gas. The ruthenium precursor can, for example, be $Ru_3(CO)_{12}$. The process gas can further contain an inert gas. The substrate can, for example, be maintained at a temperature between about 100° C. and about 400° C. during the exposing. Alternately, the substrate can be maintained at a temperature between about 150° C. and about 300° C. during the exposing. Furthermore, the process chamber can be maintained at a pressure between about 0.1 mTorr and about 200 mTorr during the exposing. According to another embodiment of the invention, the Ru layer can be deposited by exposing the substrate to a process gas containing a ruthenium organometallic precursor. The organometallic ruthenium precursor can, for example, be selected from any of the above-mentioned organometallic ruthenium precursors. The process gas can further contain an inert gas, a reducing gas (e.g., $H_2$), or a combination thereof.

In step 406, a Cu seed layer is formed on the Ru layer to prevent oxidation of the Ru layer. According to an embodiment of the invention, a thickness of the Cu seed layer can be between about 1 nm and about 10 nm. The Cu seed layer can, for example, be formed by a physical vapor deposition process. The physical vapor deposition process can, for example, be an ionized physical vapor deposition process. Step 406 may be carried out, for example, in processing system 850.

In step 408, the Cu seed layer is partially or completely oxidized. The oxidation may occur by exposing the Cu seed layer to an oxygen-containing ambient or simply by exposure to air, for example.

In step 410, a bulk Cu layer is plated on the substrate from step 408. The bulk Cu layer can, for example, be plated using the processing systems 890 or 860 described in FIG. 3. During step 410, the oxidized portion of the Cu seed layer is substantially dissolved and removed by interaction with the plating solution.

As would be appreciated by those skilled in the art, each of the steps or stages in the flowchart of FIG. 4 may encompass one or more separate steps and/or operations. Accordingly, the recitation of only five steps in 402, 404, 406, 408, 410 should not be understood to limit the method of the present invention solely to five steps or stages. Moreover, each representative step or stage 402, 404, 406, 408, 410 should not be understood to be limited to only a single process.

FIGS. 5A-6B schematically show formation of Cu interconnects according to embodiments of the invention. As those skilled in the art will readily appreciate, embodiments of the invention can be applied to a variety of patterned structures and substrates containing one or more vias or trenches, or combinations thereof.

Figure 5A:
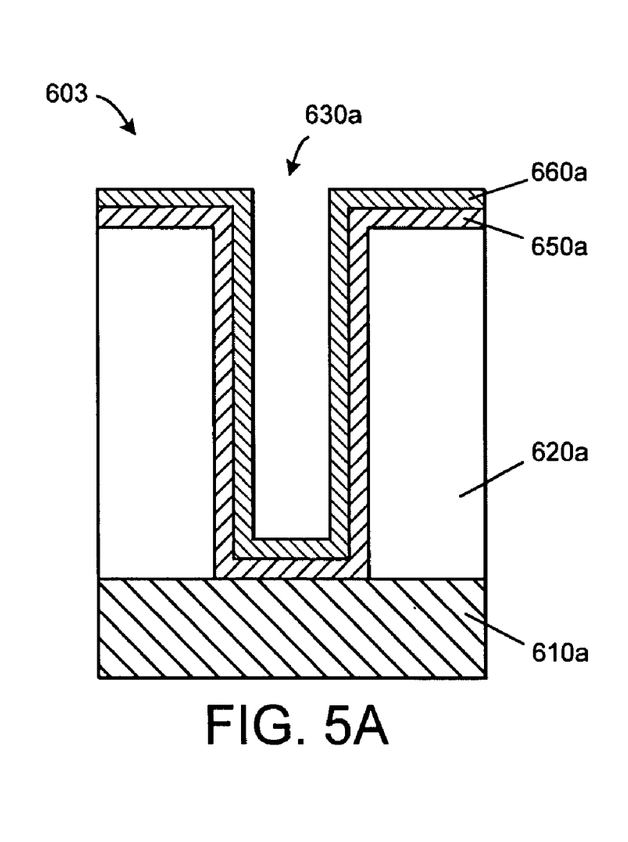
Figure 5B:
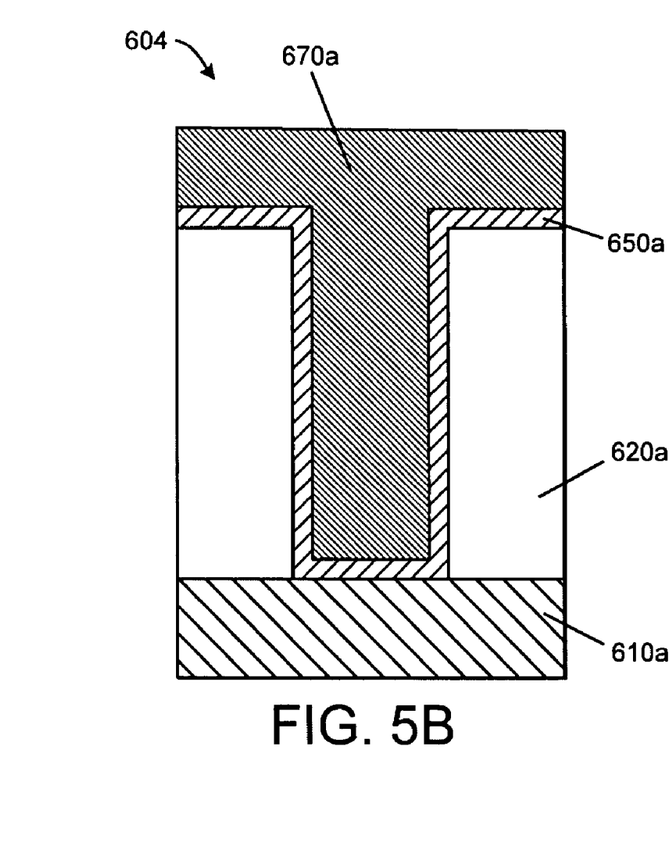

FIGS. 5A-5B schematically show formation of a Cu interconnect according to an embodiment of the invention. FIG. 5A shows a patterned structure 603 containing a first metal layer 610*a* and a patterned layer 620*a* containing an opening 630*a*. The patterned layer 620*a* can, for example, be a dielectric material. The structure 603 further contains a Ru layer 650*a* deposited on the patterned layer 620*a* and a Cu seed layer 660a formed on the Ru layer 650a. Although not shown, those skilled in the art will appreciate that the patterned structure 603 can further contain an additional barrier layer (not shown) formed on the exposed surface of the patterned layer 620a and the first metal layer 610a, underneath the Ru layer 650a. The additional barrier layer can, for example, be a tantalum-containing layer (e.g., Ta, TaN, or TaCN, or a combination thereof) or a tungsten-containing layer (e.g., W, or WN, or a combination thereof). The Cu seed layer 660a is substantially fully oxidized from exposure of the Cu seed layer to air or another oxygen-containing ambient during handling or transfer to a Cu plating system.

FIG. 5B shows a patterned structure 604 containing a bulk Cu layer 670a formed by performing a plating process on the patterned structure 603 of FIG. 5A. The oxidized Cu seed layer 660a is substantially dissolved and removed from the structure 604 during interaction with a Cu plating solution, thereby forming a bulk Cu layer 670a with good adhesion to the underlying Ru layer 650a. Thus, the fully oxidized Cu seed layer 660a is a sacrificial layer that permits bulk Cu plating onto an unoxidized Ru layer to achieve good adhesion.

Figure 6A:
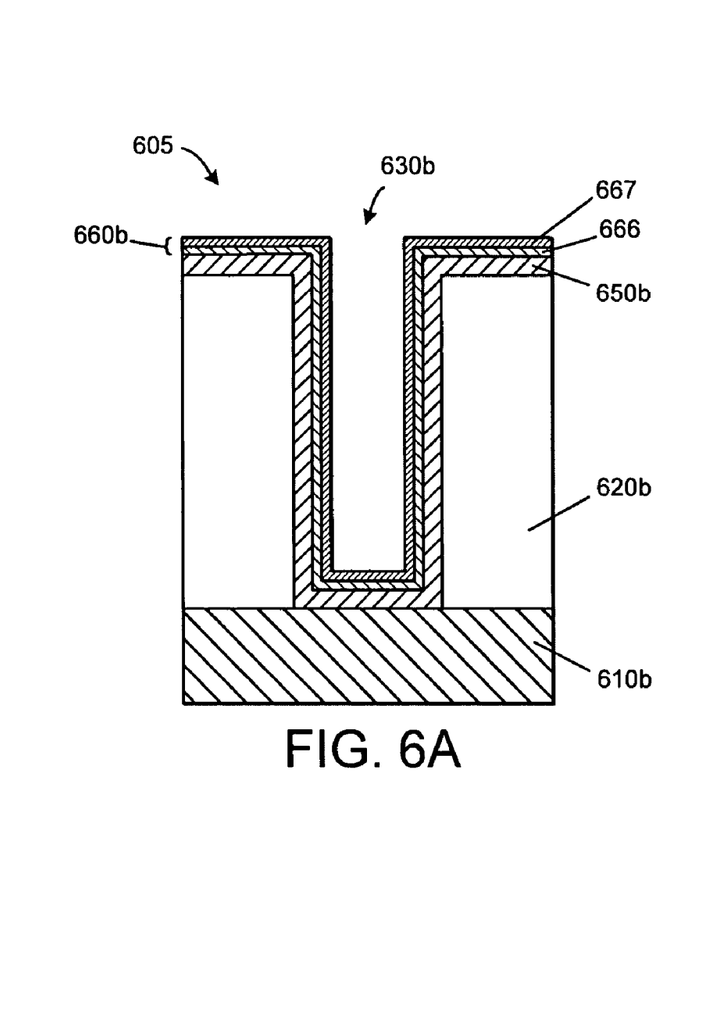
Figure 6B:
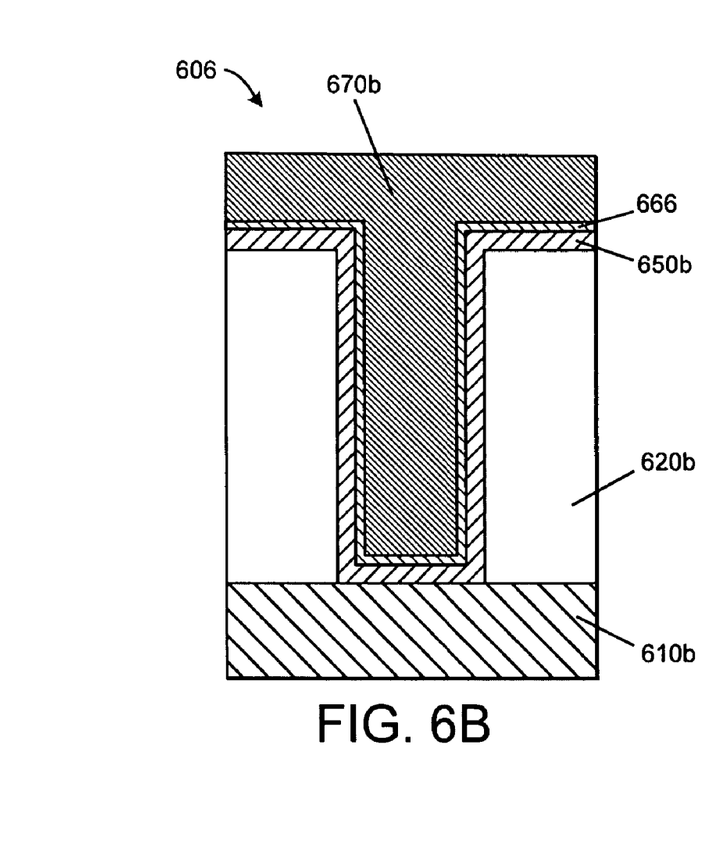

FIGS. 6A-6B schematically show formation of a Cu interconnect according to another embodiment of the invention. FIG. 6A shows a patterned structure 605 containing a first metal layer 610b and a patterned layer 620b containing an opening 630b. The structure 605 further contains a Ru layer 650b deposited onto the patterned layer 620b, a partially oxidized Cu seed layer 660b containing an unoxidized Cu seed layer portion 666 and an oxidized Cu seed layer portion 667. The oxidized Cu seed layer portion 666 can be formed by exposure of Cu seed layer 660b to air or another oxygen-containing ambient during handling or transfer to a Cu plating system.

FIG. 6B shows a patterned structure 606 containing a bulk Cu layer 670b formed by performing a plating process on the patterned structure 605 of FIG. 6A. The oxidized Cu seed layer portion 667 is substantially dissolved and removed from the structure 605 during interaction with a Cu plating solution, thereby forming a bulk Cu layer 670b with good adhesion to the underlying Cu seed layer portion 666 and the Ru layer 650b.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming Cu metallization with a barrier/seed layer, the method comprising:
   providing a substrate in a process chamber of a deposition system;
   forming a process gas containing a ruthenium carbonyl precursor vapor and a CO gas by:
   heating a solid ruthenium carbonyl precursor in a precursor vaporization system to form the ruthenium carbonyl precursor vapor, and
   flowing the CO gas in contact with the solid ruthenium carbonyl precursor in the precursor vaporization system during the heating to capture the ruthenium carbonyl precursor vapor in the CO gas as the vapor is being formed;
   transporting the process gas from the precursor vaporization system to the process chamber;
   exposing the substrate to the process gas to deposit a Ru layer on the substrate in a chemical vapor deposition process;
   forming a Cu seed layer on the Ru layer to prevent oxidation of the Ru layer;
   oxidizing at least a portion of the Cu seed layer; and
   plating a bulk Cu layer onto the substrate, wherein the plating substantially removes the oxidized portion of the Cu seed layer.

2. The method according to claim 1, wherein the heating comprises:
   heating the solid ruthenium carbonyl precursor to a temperature between about 60° C. and about 90° C. and maintaining the ruthenium carbonyl precursor at the temperature to form the ruthenium carbonyl precursor vapor.

3. The method according to claim 1, wherein the ruthenium carbonyl precursor comprises $Ru_3(CO)_{12}$.

4. The method according to claim 1, wherein the process gas further comprises an inert gas.

5. The method according to claim 1, further comprising:
   maintaining the substrate at a temperature between about 100° C. and about 400° C. during the exposing.

6. The method according to claim 1, further comprising maintaining the process chamber at a pressure between about 0.1 mTorr and about 200 mTorr during the exposing.

7. The method according to claim 1, wherein the exposing further comprises:
   performing the chemical vapor deposition process in a kinetic-limited temperature regime.

8. The method according to claim 1, wherein a thickness of the Ru layer is between about 1 nm and about 30 nm.

9. The method according to claim 1, wherein the substrate comprises a patterned substrate containing one or more vias or trenches, or combinations thereof.

10. The method according to claim 1, wherein the forming comprises a physical vapor deposition process.

11. The method according to claim 10, wherein the forming comprises an ionized physical vapor deposition process.

12. The method according to claim 1, wherein a thickness of the Cu seed layer is between about 1 nm and about 10 nm.

13. The method according to claim 1, wherein the Cu seed layer is completely oxidized prior to the plating, and the plating substantially removes the oxidized Cu seed layer whereby the bulk Cu layer is plated onto the Ru layer.

14. The method according to claim 1, wherein the substrate comprises a tantalum-containing layer or a tungsten-containing layer onto which the Ru layer is deposited.

15. A computer readable medium containing program instructions for execution on a processor, which when executed by the processor, cause a processing tool to perform the steps in the method recited in claim 1.

* * * * *